US012513821B2

United States Patent
Zhang et al.

(10) Patent No.: US 12,513,821 B2
(45) Date of Patent: Dec. 30, 2025

(54) FLEXIBLE CIRCUIT BOARD AND METHOD OF FABRICATING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei (TW)

(72) Inventors: Xiao-Juan Zhang, Hebei Province (CN); Mei Yang, Hebei Province (CN); Gang Yuan, Hebei Province (CN)

(73) Assignees: HONGQISHENG PRECISION ELECTRONICS (QINHUANGDAO) CO., LTD, Hebei Province (CN); AVARY HOLDING (SHENZHEN) CO., LTD., Shenzhen (CN); GARUDA TECHNOLOGY CO., LTD., New Taipei (TW)

(*) Notice: Subject to any disclaimer, the term of this patent is extended or adjusted under 35 U.S.C. 154(b) by 182 days.

(21) Appl. No.: 18/361,106

(22) Filed: Jul. 28, 2023

(65) Prior Publication Data

US 2025/0031306 A1 Jan. 23, 2025

(30) Foreign Application Priority Data

Jul. 20, 2023 (CN) .......................... 202310897081.9

(51) Int. Cl.
 *H05K 1/03* (2006.01)
 *H05K 1/09* (2006.01)
 *H05K 3/10* (2006.01)

(52) U.S. Cl.
 CPC .......... *H05K 1/0393* (2013.01); *H05K 1/092* (2013.01); *H05K 3/107* (2013.01);
 (Continued)

(58) Field of Classification Search
 CPC .. H05K 1/0221; H05K 1/0296; H05K 1/0393; H05K 1/0218; H05K 1/245; H05K 2201/09809
 See application file for complete search history.

(56) References Cited

U.S. PATENT DOCUMENTS

| 9,872,390 B1* | 1/2018 | Holbery | ................... H05K 1/14 |
| 2008/0078573 A1* | 4/2008 | Hu | ....................... H05K 1/0219 174/262 |

(Continued)

FOREIGN PATENT DOCUMENTS

| CN | 101160017 A | 4/2008 |
| CN | 108457079 A | 8/2018 |

(Continued)

*Primary Examiner* — Roshn K Varghese
(74) *Attorney, Agent, or Firm* — MUNCY, GEISSLER, OLDS & LOWE, P.C.

(57) ABSTRACT

A flexible circuit board and a method of fabricating the same are provided. The flexible circuit board includes a first dielectric layer, a second dielectric layer disposed on the first dielectric layer, a signal layer disposed within the second dielectric layer, a third dielectric layer disposed on the second dielectric layer, and liquid metal composites. The signal layer includes a trace and a pad. The liquid metal composites are disposed to surround the trace, but not enclose the pad, thereby satisfying requirements of the signal layer for great bending numbers and high frequency signal transmission.

10 Claims, 7 Drawing Sheets

(52) U.S. Cl.
CPC ............... *H05K 2201/0141* (2013.01); *H05K 2201/0154* (2013.01); *H05K 2201/0195* (2013.01)

(56) References Cited

U.S. PATENT DOCUMENTS

| | | |
|---|---|---|
| 2020/0333091 A1 | 10/2020 | Busche |
| 2022/0140514 A1* | 5/2022 | Buck .................. H01R 13/025 439/493 |
| 2023/0171877 A1 | 6/2023 | Wei et al. |

FOREIGN PATENT DOCUMENTS

| | | | |
|---|---|---|---|
| CN | 109643696 | A | 4/2019 |
| CN | 110494985 | A | 11/2019 |
| CN | 113527733 | A | 10/2021 |
| CN | 114449742 | A | 5/2022 |
| CN | 216561325 | U | 5/2022 |
| CN | 115665994 | A | 1/2023 |
| CN | 116056308 | A | 5/2023 |
| KR | 10-2016-0073860 | A | 6/2016 |
| WO | WO2016104066 | A1 | 6/2016 |
| WO | WO2023093690 | A1 | 6/2023 |

\* cited by examiner

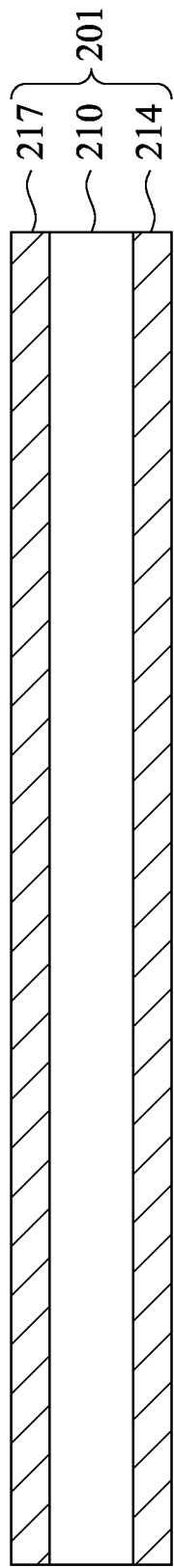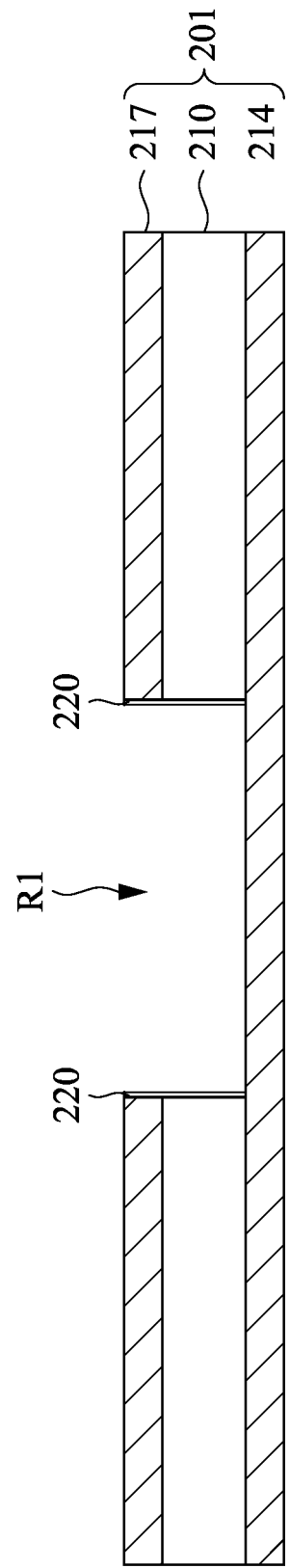

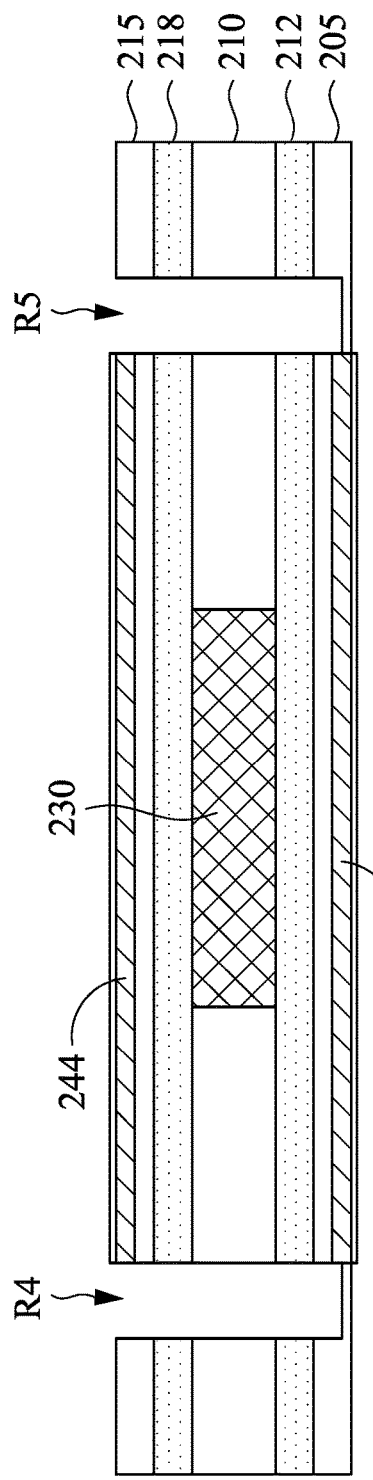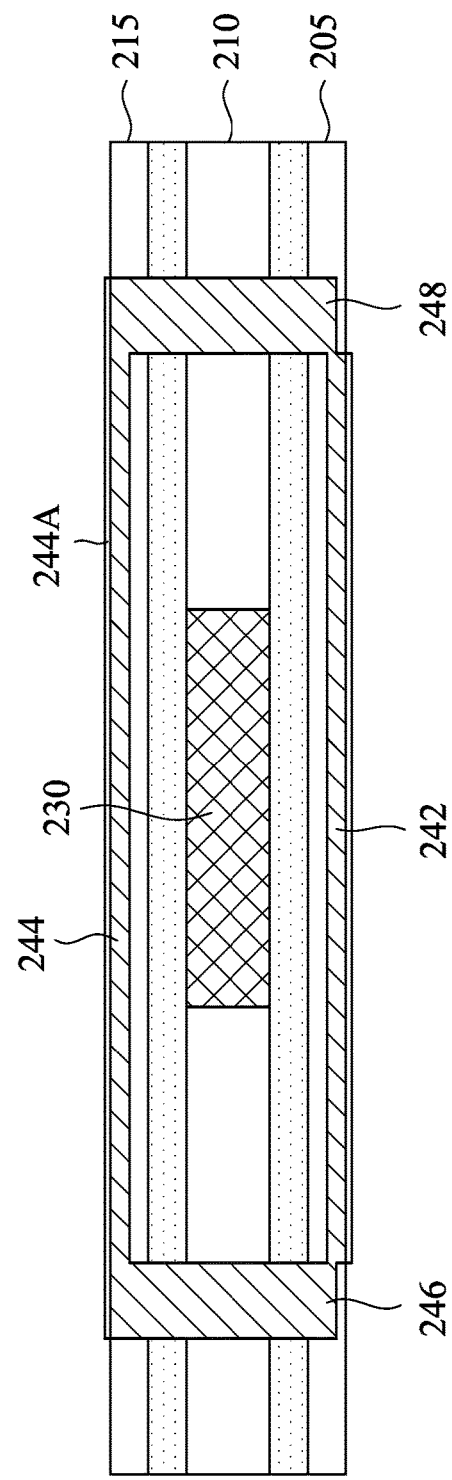

FLEXIBLE CIRCUIT BOARD AND METHOD OF FABRICATING THE SAME

RELATED APPLICATION

This application claims priority to China Application Serial Number 202310897081.9, filed Jul. 20, 2023, which is herein incorporated by reference.

BACKGROUND

Field of Invention

The present invention relates to a flexible circuit board and a method of fabricating the same. More particularly, the present invention relates to the flexible circuit board for high frequency signal transmission and the method of fabricating the same.

Description of Related Art

In recent years, demand for electronic products associated with foldable devices, such as laptop and wearable devices for augmented reality (AR)/virtual reality (VR), and foldable screen, such as cell phone and tablet, are gradually increasing. However, data transmission is still in operation when folding the electronic product, but demand for circuit boards has also increased correspondingly with thinning of the products and increasing in transmission rate, especially in bending property of the circuit board and high frequency signal transmission.

SUMMARY

An aspect of the present invention provides a flexible circuit board, which disposes a signal layer within a dielectric layer and uses a liquid metal surrounding a trace of the signal layer to require demand for bending and high frequency signal transmission.

Another aspect of the present invention provides a method of fabricating the flexible circuit board.

According to the aspect of the present invention, a flexible circuit board is provided. The flexible circuit board includes a first dielectric layer; a second dielectric layer disposed on the first dielectric layer; a signal layer disposed within the second dielectric layer; a third dielectric layer disposed on the second dielectric layer; and plural liquid metal composites. The signal layer includes a trace and a pad, and the liquid metal composites are disposed to surround the trace but not enclose the pad.

According to an embodiment of the present invention, the liquid metal composites include plural liquid metal composite side portions and plural liquid metal composite layers. The liquid metal composite side portions extend from the third dielectric layer through the second dielectric layer into the first dielectric layer. The liquid metal composite layers are disposed within the first dielectric layer and the third dielectric layer and connected to the plural liquid metal composite side portions.

According to an embodiment of the present invention, the liquid metal composites further includes plural liquid metal protective films, which are respectively disposed on the liquid metal composite layers. The liquid metal protective films cover surfaces of the liquid metal composite layers exposed on the first dielectric layer and the third dielectric layer, respectively.

According to an embodiment of the present invention, the flexible circuit board further includes an electronic component disposed on the pad and electrically connected to the pad.

According to an embodiment of the present invention, the liquid metal composites include liquid metal and cellulose nanofiber.

According to an embodiment of the present invention, the flexible circuit board further includes a first adhesive layer disposed between the first dielectric layer and the second dielectric layer; and a second adhesive layer disposed between the second dielectric layer and the third dielectric layer.

According to an embodiment of the present invention, the second dielectric layer and the third dielectric layer include polyimide (PI), liquid crystal polymer (LCP) or combination thereof.

According to another aspect of the present invention, a method of fabricating a flexible circuit board is provided. The method includes providing a substrate, in which the substrate includes a dielectric layer; forming a first recess within the substrate; forming a signal layer in the first recess; forming a lower dielectric layer and a first adhesive layer below the dielectric layer and the signal layer; forming a lower dielectric layer and a first adhesive layer below the dielectric layer and the signal layer; forming a second recess and a third recess within the lower dielectric layer and the upper dielectric layer, respectively, in which the first adhesive layer is not exposed by the second recess, and the second adhesive layer is not exposed by the third recess; filling plural liquid metal composite layers in the second recess and the third recess; forming a fourth recess and a fifth recess at two sides of the signal layer, and the signal layer is not exposed, in which the fourth recess and the fifth recess extend from the upper dielectric layer through the dielectric layer into the lower dielectric layer; and filling plural liquid metal composite side portions into the fourth recess and the fifth recess.

According to an embodiment of the present invention, the substrate includes two metal layers, the dielectric layer is located between the metal layers, and the first recess does not extend through one of the metal layers.

According to an embodiment of the present invention, the method further includes removing the metal layers after forming the signal layer and before forming the lower dielectric layer and the first adhesive layer.

According to an embodiment of the present invention, filling the liquid metal composite layers further includes forming, respectively, plural liquid metal protective films on surfaces of the liquid metal composite layers exposed on the upper dielectric layer and the lower dielectric layer.

According to an embodiment of the present invention, the liquid metal composite side portions and the liquid metal composite layers are disposed around the signal layer, and the liquid metal composite side portions are connected to the liquid metal composite layers.

According to an embodiment of the present invention, the signal layer includes a trace and a pad, in which the trace is surrounded by the liquid metal composite side portions and the liquid metal composite layers, and the pad is not surrounded by the liquid metal composite side portions and the liquid metal composite layers.

According to an embodiment of the present invention, the liquid metal composite side portions and the liquid metal composite layers include liquid metal and cellulose nanofiber.

According to the aspect of the present invention, a flexible circuit board is provided. The flexible circuit board includes a first dielectric layer; a first adhesive layer disposed on the first dielectric layer; a second dielectric layer disposed on the first adhesive layer; a second adhesive layer disposed on the second dielectric layer; a third dielectric layer disposed on the second adhesive layer; a signal layer disposed within the second dielectric layer; two liquid metal composite side portions disposed beside the signal layer; and two liquid metal composite layers disposed within the first dielectric layer and the third dielectric layer, respectively. The liquid metal composite side portions extend from the third dielectric layer through the second adhesive layer, the second dielectric layer and the first adhesive layer into the first dielectric layer. A portion of the signal layer is surrounded by the liquid metal composite side portions and the liquid metal composite layers.

According to an embodiment of the present invention, the signal layer includes a trace and a pad, and the liquid metal composite side portions and the liquid metal composite layers enclose the trace but not enclose the pad.

According to an embodiment of the present invention, the flexible circuit board further includes two liquid metal protective films disposed on the liquid metal composite layers, respectively. The liquid metal protective film cover surfaces of the liquid metal composite layers exposed on the first dielectric layer and the third dielectric layer, respectively.

According to an embodiment of the present invention, the flexible circuit board further includes at least an electronic component disposed on the remaining portion of the signal layer. The remaining portion of the signal layer is not surrounded by the liquid metal composite side portions and the liquid metal composite layers.

According to an embodiment of the present invention, the first adhesive layer and the second adhesive layer include bonding sheet (BS).

According to an embodiment of the present invention, the first dielectric layer, the second dielectric layer and the third dielectric layer include polyimide (PI) or liquid crystal polymer (LCP).

Application of the flexible circuit board and the method of fabricating the same can satisfy requirements of the signal layer for great bending numbers and high frequency signal transmission by embedding the signal layer into the dielectric layer and surrounding the trace of the signal layer by the liquid metal composites. Moreover, the electronic component can be disposed directly on the pad of the signal layer, thereby benefiting signal transmission.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H illustrate cross-sectional views of a flexible circuit board during various fabrication stages according to some embodiments of this invention.

DETAILED DESCRIPTION

Figure 1A:
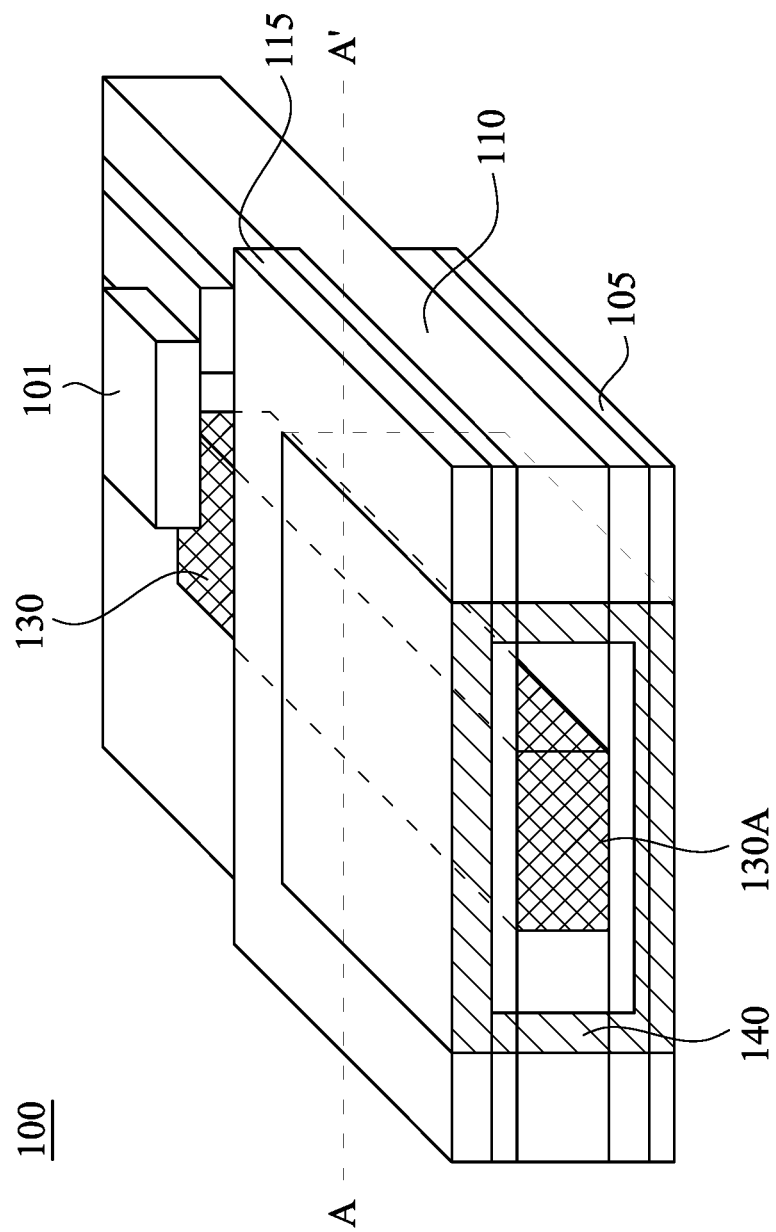
FIG. 1A illustrates a perspective view of a flexible circuit board according to some embodiments of the present invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Design of three-layer stack of a conventional flexible circuit board should dispose isolation holes around a signal line, but isolation effect works only if pitches of the isolation holes achieve at least 1/20 of transmission wavelength. Therefore, requirements of high frequency transmission cannot be satisfied. Moreover, in order to satisfy great bending numbers for the conventional flexible circuit board, bending regions usually only include signal lines and substrate, thereby decreasing thickness and increasing flexibility. However, such design exhibits radiation and crosstalk of the signal due to lack of shielding layers. Therefore, conventionally, the aforementioned problem is solved by disposing electromagnetic shielding layers, but the electromagnetic shielding layers (such as copper layer) limit the bending numbers, and there is risk of popcorn due to thermal stress. In addition, since the isolation holes usually include electroplated copper, the circuit board may crack during bending. Thus the isolation holes should not be disposed in the bending regions.

Therefore, according to above, a flexible circuit board and a method of fabricating the same are provided. A signal layer is embedded into a dielectric layer, and a trace of the signal layer is surrounded by liquid metal composites; thus requirements of the signal layer for great bending numbers and high frequency transmission can be satisfied. Moreover, an electronic component can be disposed directly on the pad of the signal layer, thereby benefiting signal transmission.

Figure 1B:
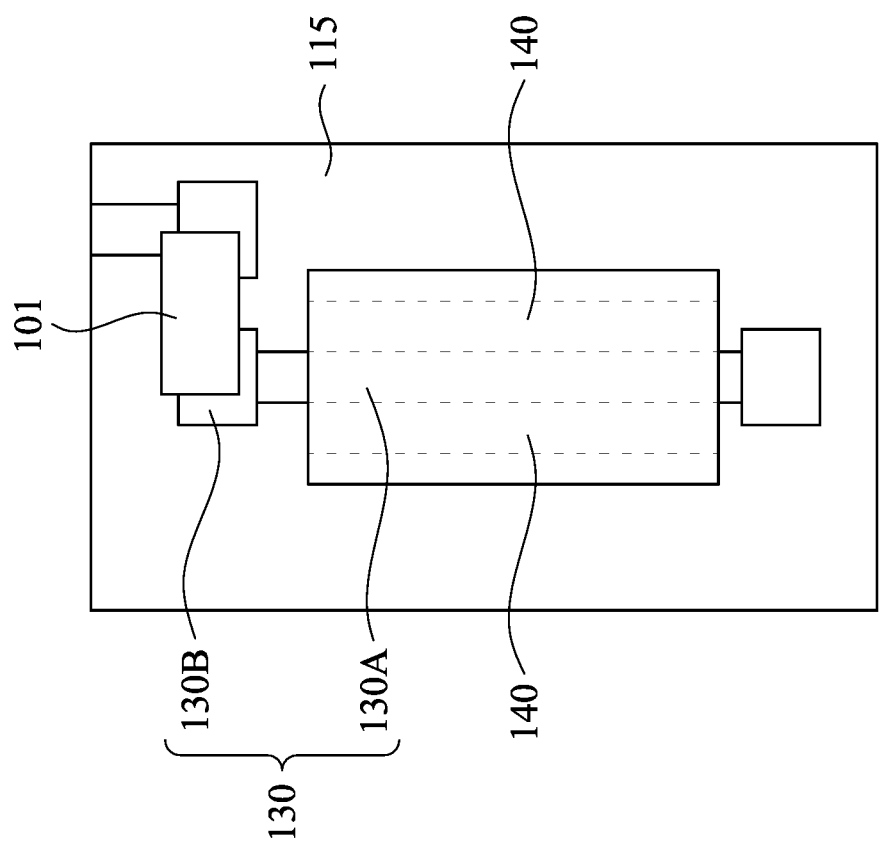
FIG. 1B illustrates a top view of a flexible circuit board according to some embodiments of the present invention.

Referring to FIGS. 1A and 1B, FIGS. 1A and 1B illustrate a perspective view and a top view of a flexible circuit board 100, respectively. The flexible circuit board 100 includes a first dielectric layer 105, a second dielectric layer 110 and a third dielectric layer 115. In some embodiments, the second dielectric layer 110 is disposed on the first dielectric layer 105, and the third dielectric layer 115 is disposed on the second dielectric layer 110.

The flexible circuit board 100 includes a trace 130A of the signal layer and liquid metal composites 140 surrounding the trace 130A. As shown in FIG. 1B, the signal layer 130 includes the trace 130A and a pad 130B. It is understood that the pad 130B is not shown in FIG. 1A. In some embodiments, the liquid metal composites 140 only enclose the trace 130A of the signal layer 130, but not enclose the pad 130B. In some embodiments, the flexible circuit board 100 further includes an electronic component 101. Compared to a conventional signal layer, which is electrically connected to the electronic component by using via holes, the pad 130B of the signal layer 130 of the flexible circuit board 100 is exposed, and thus the electronic component 101 can be directly disposed on the pad 130B and electrically connected to the pad 130B, and the electronic component 101 is electrically connected to the signal layer 130 through the pad 130B. As such, it is beneficial for signal transmission and miniaturization of electronic products.

Figure 2:
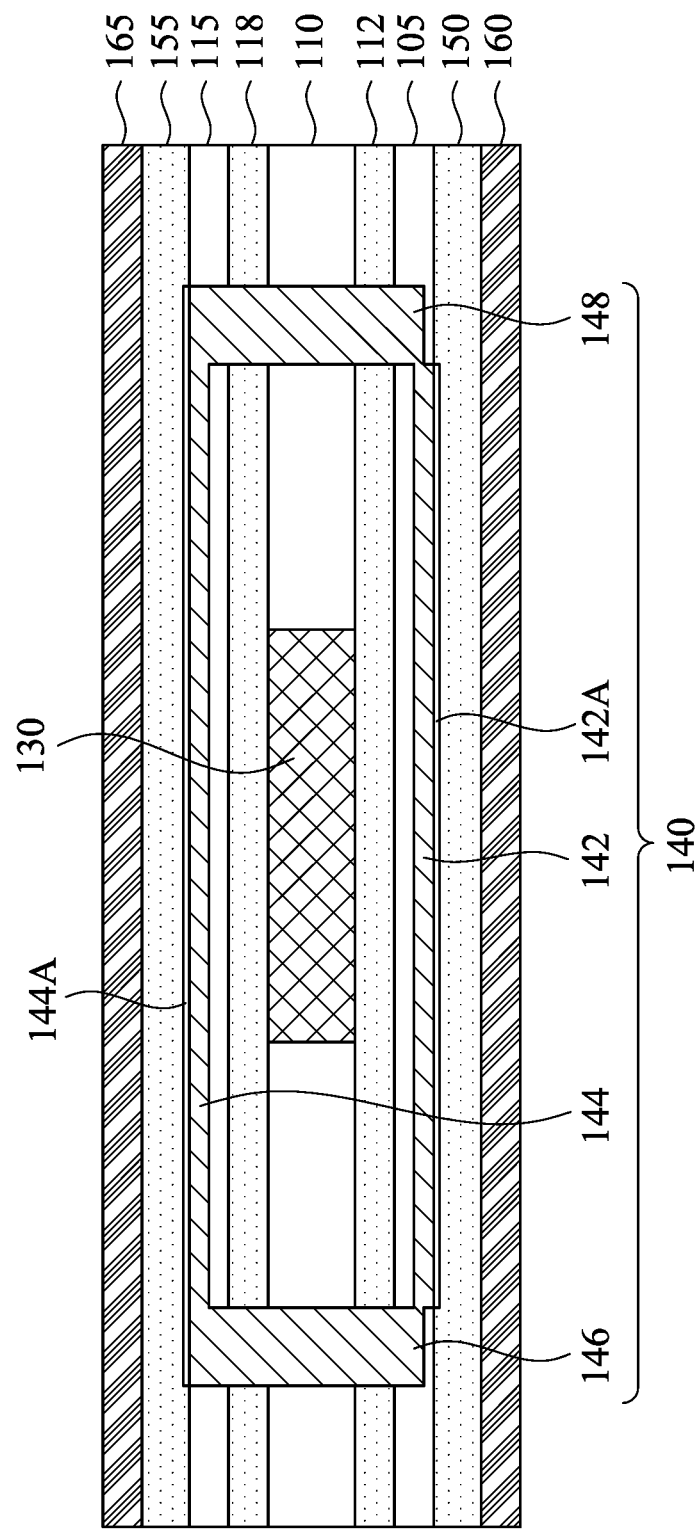
FIG. 2 illustrates a cross-sectional view of a flexible circuit board according to some embodiments of the present invention.

Referring to FIG. 2, FIG. 2 illustrates a cross-sectional view of the flexible circuit board 100 along a cross-sectional line A-A' in FIG. 1A. As described above, the second dielectric layer 110 is disposed on the first dielectric layer 105, while the first dielectric layer 105 and the second dielectric layer 110 are bonding with a first adhesive layer 112 interposed therebetween; and the third dielectric layer 115 is disposed on the second dielectric layer 110, while the second dielectric layer 110 and the third dielectric layer 115 are bonding with a second adhesive layer 118 interposed therebetween.

As shown in FIG. 2, the signal layer 130 is disposed within the second dielectric layer 110. In some embodiments, the signal layer 130 is located between the first adhesive layer 112 and the second adhesive layer 118. The liquid metal composites 140 includes a liquid metal composite layer 142, a liquid metal composite layer 144, a liquid metal composite side portion 146 and a liquid metal composite side portion 148. In some embodiments, the liquid metal composite layer 142 and the liquid metal composite layer 144 are connected to the liquid metal composite side portion 146 and the liquid metal composite side portion 148; hence the liquid metal composites 140 can enclose the signal layer 130, but not physically contact the signal layer 130.

In some embodiments, the liquid metal composite side portion 146 and the liquid metal composite side portion 148 are disposed at opposite sides of the signal layer 130, respectively, and the liquid metal composite side portion 146 and the liquid metal composite side portion 148 extend from the third dielectric layer 115 through the second dielectric layer 110 into the first dielectric layer 105, but not penetrate through the first dielectric layer 105.

In some embodiments, the liquid metal composite layer 142 is disposed in the first dielectric layer 105, and the liquid metal composite layer 144 is disposed in the third dielectric layer 115. In order to protect the liquid metal composite layer 142 and the liquid metal composite layer 144 from directly contacting a glue layer 150 and a glue layer 155 (described in following), the liquid metal composites 140 further includes a liquid metal protective film 142A disposed on the liquid metal composite layer 142 and a liquid metal protective film 144A disposed on the liquid metal composite layer 144. In some examples, the liquid metal protective film 142A cover on a surface of the liquid metal composite layer 142 exposed on the first dielectric layer 105, while the liquid metal protective film 144A cover on a surface of the liquid metal composite layer 144 exposed on the third dielectric layer 115.

In some embodiments, the liquid metal composites 140 are made from using cellulose nanofiber (CNF) as a base and liquid metal (LM) as filler, and are formed as stable composites after freeze drying. Then, composite shielding films are formed by using mechanical lamination. Therefore, the liquid metal composites 140 have multiple layers of electric transmission path and have an electrical conductivity up to 96000 S/m. In some embodiments, in a range of 4 GHz to 18 GHz, electromagnetic shielding effect of the liquid metal composites 140 can reach up to 65 dB. In some embodiments, after thermal treatment at 120° C. for 8 hours, the electromagnetic shielding effect of the liquid metal composites 140 can still remain stable. The liquid metal composites 140 can be stretched, and thus the signal layer 130 can satisfy the requirements for dynamic bending and great bending numbers. Moreover, the liquid metal composites 140 can be used as isolation recess to shield the signal layer 130, and the liquid metal composites 140 further have heat dissipation effect and satisfy requirements for high frequency transmission of millimeter wave.

In some embodiments, the flexible circuit board 100 further includes the glue layer 150, the glue layer 155, a cover film 160 and a cover film 165. The glue layer 150 cover on the first dielectric layer 105 and the liquid metal composite layer 142 (and the liquid metal protective film 142A), and the cover film 160 is disposed on the glue layer 150; similarly, the glue layer 155 cover on the third dielectric layer 115 and the liquid metal composite layer 144 (and the liquid metal protective film 144A), and the cover film 165 is disposed on the glue layer 155.

Referring to FIGS. 3A-3H, FIGS. 3A-3H illustrate cross-sectional views of a flexible circuit board (e.g. the flexible circuit board 100) during various fabrication stages according to some embodiments of this invention. First, referring to FIG. 3A, a substrate 201 is provided. The substrate 201 includes a dielectric layer 210, a metal layer 214 and a metal layer 217, in which the dielectric layer 210 is located between the metal layer 214 and the metal layer 217. In some embodiments, the dielectric layer 210 includes polyimide (PI), liquid crystal polymer (LCP) or other dielectric material with low dielectric constant ($D_k$)/dielectric dissipation factor ($D_f$), and the metal layer 214 and the metal layer 217 may be copper. In some examples, the substrate 201 may be flexible copper clad laminate (FCCL).

Subsequently, referring to FIG. 3B, a first recess R1 is formed in the substrate 201. The first recess R1 extends from the metal layer 217 to the dielectric layer 210, but not extends to the metal layer 214. In some embodiments, the first recess R1 is formed by using laser or other suitable method. In addition, in some embodiments, a shadow treatment is performed to sidewalls between the first recess R1 and the substrate 201 to make graphite dip coat on the sidewalls, thereby forming conductive layers 220.

Figure 3C:
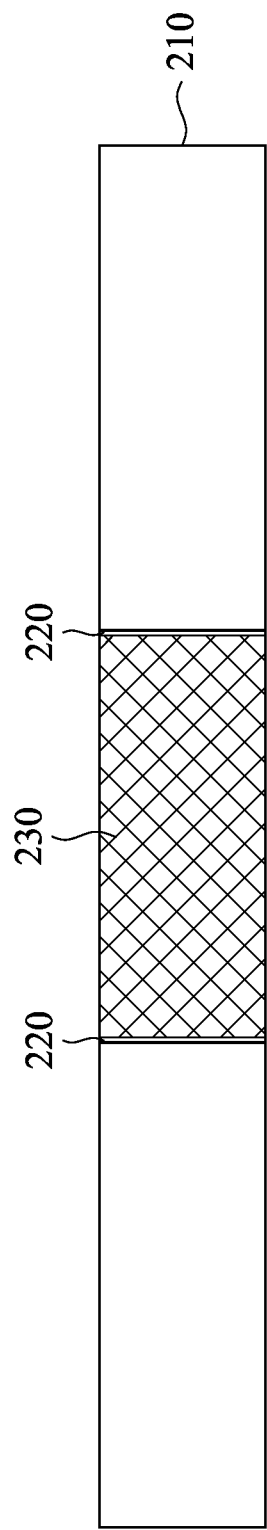

Then, referring to FIG. 3C, a signal layer 230 is formed in the first recess R1 (see FIG. 3B). In some embodiments, the signal layer 230 may include copper and may be formed by using electroplating, and disposition of the conductive layers 220 with conductive graphite is beneficial to perform the electroplating process. After forming the signal layer 230, the metal layer 214 and the metal layer 217 (see FIG. 3B) are removed.

Figure 3D:
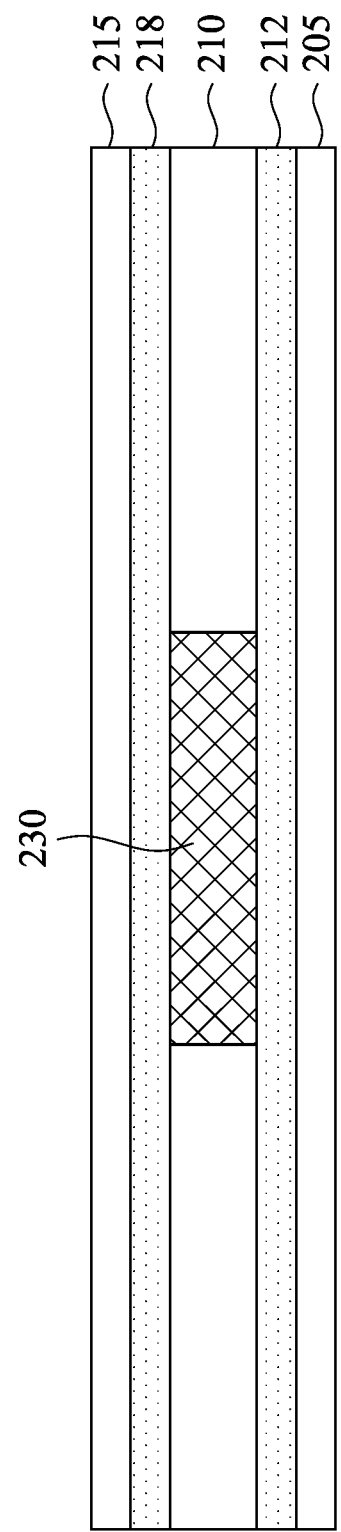

Referring to FIG. 3D, a first adhesive layer 212 and a second adhesive layer 218 are formed below and above the dielectric layer 210 and the signal layer 230, respectively, and then a lower dielectric layer 205 and an upper dielectric layer 215 are formed on the first adhesive layer 212 and the second adhesive layer 218, respectively. As such, the dielectric layer 210 is located between the lower dielectric layer 205 and the upper dielectric layer 215. In some embodiments, the first adhesive layer 212 and the second adhesive layer 218 include bonding sheet (BS). In some embodiments, the lower dielectric layer 205 and the upper dielectric layer 215 include polyimide (PI), liquid crystal polymer (LCP) or other dielectric material with low dielectric constant $(D_k)$/dielectric dissipation factor $(D_f)$.

Figure 3E:
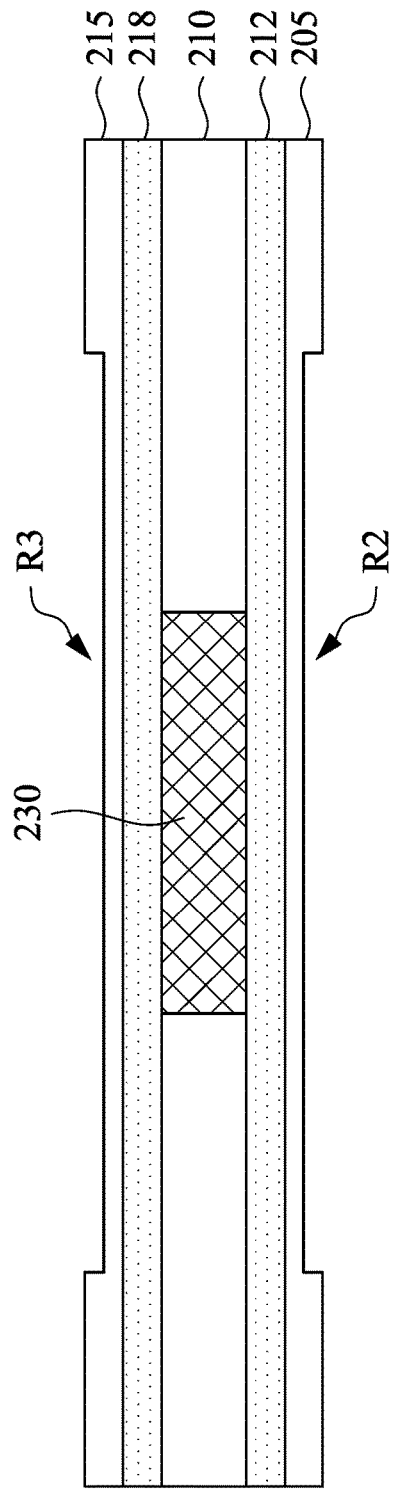

Subsequently, referring to FIG. 3E, a second recess R2 is formed in the lower dielectric layer 205, and a third recess R3 is formed in the upper dielectric layer 215. The second recess R2 extends from a surface of the lower dielectric layer 205 toward the signal layer 230, but not expose the first adhesive layer 212; similarly, the third recess R3 extends from a surface of the upper dielectric layer 215 toward the signal layer 230, but not expose the second adhesive layer 218. In some embodiments, the second recess R2 and the third recess R3 may be formed by using a controlled depth laser process or other suitable method.

Figure 3F:
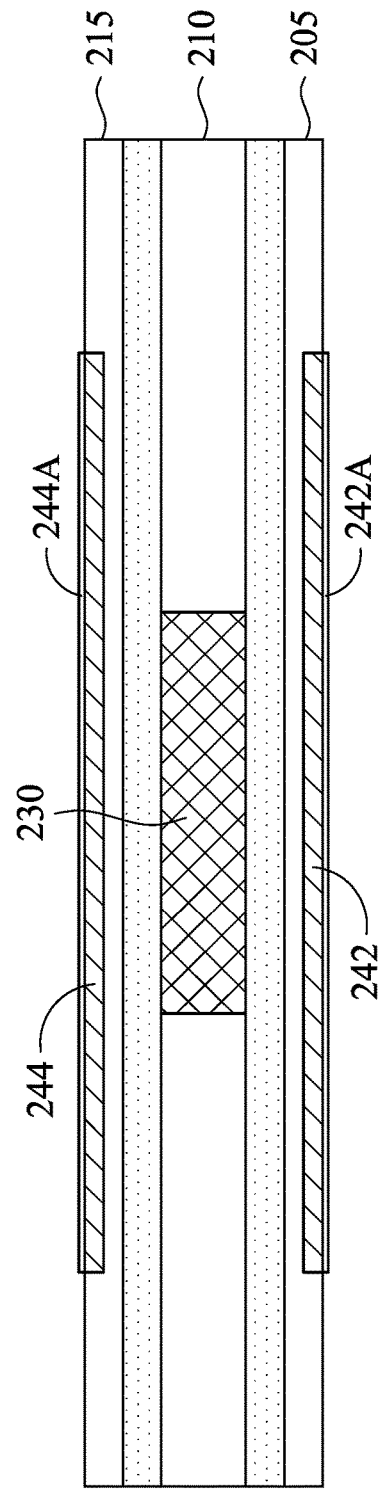

Referring to FIG. 3F, the second recess R2 and the third recess R3 (see FIG. 3E) are filled with liquid metal composite material to form a liquid metal composite layer 242 and a liquid metal composite layer 244. In some embodiments, the liquid metal composite material includes cellulose nanofiber and liquid metal. Since the liquid metal composite material can be stretched, shape of the liquid metal composite material may change according to shape of the second recess R2 and the third recess R3. In some embodiments, a liquid metal protective film 242A is formed on a surface of the liquid metal composite layer 242, and a liquid metal protective film 244A is formed on a surface of the liquid metal composite layer 244, thereby achieving encapsulation.

Referring to FIG. 3G, a fourth recess R4 and a fifth recess R5 are formed at two sides of the signal layer 230, but the signal layer 230 are not exposed. The fourth recess R4 and the fifth recess R5 extend from the upper dielectric layer 215 sequentially through the second adhesive layer 218, the dielectric layer 210 and the first adhesive layer 212 into the lower dielectric layer 205, but not penetrate through the lower dielectric layer 205. In some embodiments, the fourth recess R4 and the fifth recess R5 expose the liquid metal composite layer 242 and the liquid metal composite layer 244.

Subsequently, referring to FIG. 3H, the fourth recess R4 and the fifth recess R5 (see FIG. 3G) are filled with the liquid metal composite material to form the liquid metal composite side portion 246 and the liquid metal composite side portion 248, respectively. Since the liquid metal composite material can be stretched, shape of the liquid metal composite material may change according to shape of the fourth recess R4 and the fifth recess R5. The liquid metal composite side portion 246 and the liquid metal composite side portion 248 are connected to two ends of the liquid metal composite layer 242 and the liquid metal composite layer 244. In some embodiments, top portions of the liquid metal composite side portion 246 and the liquid metal composite side portion 248 are coplanar with a top surface of the liquid metal composite layer 244. Therefore, in some embodiments, the liquid metal protective film 244A may be formed after forming the liquid metal composite side portion 246 and the liquid metal composite side portion 248; hence the top surface of the liquid metal composite layer 244 and top portions of the liquid metal composite side portion 246 and the liquid metal composite side portion 248 are covered.

Then, the glue layers and the cover films are selectively disposed above and below the structure shown in FIG. 3H, and thus the flexible circuit board 100 shown in FIG. 2 may be formed.

As described above, the flexible circuit board and the method of fabricating the same are provided. A signal layer is embedded into a dielectric layer, and a trace of the signal layer is surrounded by liquid metal composites; thus requirements of the signal layer for great bending numbers and high frequency transmission can be satisfied. Moreover, the signal layer further includes the pad, which is not surrounded by the liquid metal composites, and the electronic component can be electrically connected to the pad directly, thereby benefiting signal transmission and miniaturization of electronic products.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A flexible circuit board, comprising:
   a first dielectric layer;
   a second dielectric layer, disposed on the first dielectric layer;
   a signal layer, disposed within the second dielectric layer, wherein the signal layer comprises a trace and a pad;
   a third dielectric layer, disposed on the second dielectric layer; and
   a plurality of liquid metal composites, disposed to surround the trace but not enclose the pad, further comprising:
      a plurality of liquid metal composite side portions, wherein the plurality of liquid metal composite side portions extend from the third dielectric layer through the second dielectric layer into the first dielectric layer;
      a plurality of liquid metal composite layers, disposed within the first dielectric layer and the third dielectric layer and connected to the plurality of liquid metal composite side portions; and
      a plurality of liquid metal protective films, respectively disposed on the plurality of liquid metal composite layers, wherein the plurality of liquid metal protective films cover surfaces of the plurality of the liquid metal composite layers exposed on the first dielectric layer and the third dielectric layer, respectively.

2. The flexible circuit board of claim 1, further comprising:
   an electronic component, disposed on the pad and electrically connected to the pad.

3. The flexible circuit board of claim 1, wherein the plurality of liquid metal composites comprise liquid metal and cellulose nanofiber.

4. The flexible circuit board of claim 1, further comprising:
a first adhesive layer, disposed between the first dielectric layer and the second dielectric layer; and
a second adhesive layer, disposed between the second dielectric layer and the third dielectric layer.

5. The flexible circuit board of claim 1, wherein the first dielectric layer, the second dielectric layer and the third dielectric layer comprise polyimide (PI), liquid crystal polymer (LCP) or combination thereof.

6. A flexible circuit board, comprising:
a first dielectric layer;
a first adhesive layer, disposed on the first dielectric layer;
a second dielectric layer, disposed on the first adhesive layer;
a second adhesive layer, disposed on the second dielectric layer;
a third dielectric layer, disposed on the second adhesive layer;
a signal layer, disposed within the second dielectric layer;
two liquid metal composite side portions, disposed beside the signal layer, wherein the liquid metal composite side portions extend from the third dielectric layer through the second adhesive layer, the second dielectric layer and the first adhesive layer into the first dielectric layer;
two liquid metal composite layers, disposed within the first dielectric layer and the third dielectric layer, respectively, wherein a portion of the signal layer is surrounded by the liquid metal composite side portions and the liquid metal composite layers; and
two liquid metal protective films, disposed on the liquid metal composite layers, respectively, wherein the liquid metal protective films cover surfaces of the liquid metal composite layers exposed on the first dielectric layer and the third dielectric layer, respectively.

7. The flexible circuit board of claim 6, wherein the signal layer comprises a trace and a pad, and the liquid metal composite side portions and the liquid metal composite layers enclose the trace but not enclose the pad.

8. The flexible circuit board of claim 6, further comprising:
at least an electronic component, disposed on a remaining portion of the signal layer, wherein the remaining portion of the signal layer is not surrounded by the liquid metal composite side portions and the liquid metal composite layers.

9. The flexible circuit board of claim 6, wherein the first adhesive layer and the second adhesive layer comprise bonding sheet (BS).

10. The flexible circuit board of claim 6, wherein the first dielectric layer, the second dielectric layer and the third dielectric layer comprise polyimide (PI) or liquid crystal polymer (LCP).

* * * * *